(12) United States Patent
Kumazaki

(10) Patent No.: US 8,312,411 B2
(45) Date of Patent: Nov. 13, 2012

(54) WIRING VERIFICATION SYSTEM, WIRING VERIFICATION METHOD, AND WIRING VERIFICATION PROGRAM PRODUCT

(75) Inventor: Masahito Kumazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 141 days.

(21) Appl. No.: 12/730,993

(22) Filed: Mar. 24, 2010

(65) Prior Publication Data

US 2010/0251195 A1    Sep. 30, 2010

(51) Int. Cl.
G06F 11/22   (2006.01)
G06F 17/50   (2006.01)

(52) U.S. Cl. .................... 716/137; 716/136

(58) Field of Classification Search ............ 716/136, 716/137
See application file for complete search history.

(56) References Cited

U.S. PATENT DOCUMENTS

| | | | |
|---|---|---|---|
| 2003/0009727 A1* | 1/2003 | Takeyama et al. | 716/1 |
| 2004/0163058 A1* | 8/2004 | Frank et al. | 716/5 |
| 2006/0236276 A9* | 10/2006 | Frank et al. | 716/5 |
| 2008/0005708 A1* | 1/2008 | Sato et al. | 716/5 |

FOREIGN PATENT DOCUMENTS

| | | |
|---|---|---|
| JP | 8-288395 A | 11/1996 |
| JP | 10-154793 A | 6/1998 |
| JP | 2000123060 A | 4/2000 |
| JP | 2001325315 A | 11/2001 |
| JP | 2003337841 A | 11/2003 |
| JP | 2005038150 A | 2/2005 |
| JP | 2005100171 A | 4/2005 |
| JP | 2006252285 A | 9/2006 |
| JP | 3991224 B | 8/2007 |
| WO | 2009037739 A | 3/2009 |

OTHER PUBLICATIONS

Japanese Notification for JP2009-087253 dated Feb. 1, 2011.
Japanese Office Action for JP2009-088253 dated Nov. 30, 2011.
Japanese Office Action for JP2009-088253 dated Jun. 14, 2011.

* cited by examiner

*Primary Examiner* — Suresh Memula

(57) ABSTRACT

A wiring verification system is provided which is capable of simultaneously solving problems of wiring constraints on each board and of total skew in a wire passing through a plurality of boards. Board data, external connection board data, inter-board connection information, and wiring constraints are inputted in advance. When a system netlist creating unit (including a software means) creates a system netlist showing a theoretical connection relation of each board, an external connection tracing unit (including a software means) extracts external connection information based on the system netlist. An external load producing unit (including a software means) produces an external dummy load converted to a wire length or wire delay of the outside based on extracted external connection information. A wiring verification unit (including a software means) performs verification of a wiring state of an entire board by using the produced external dummy load. This enables proper distribution of wiring constraints on each board and solution of the total skew simultaneously.

18 Claims, 6 Drawing Sheets

*FIG.3*
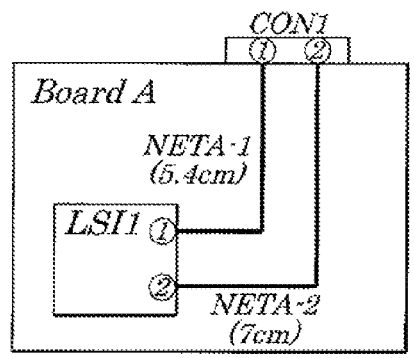
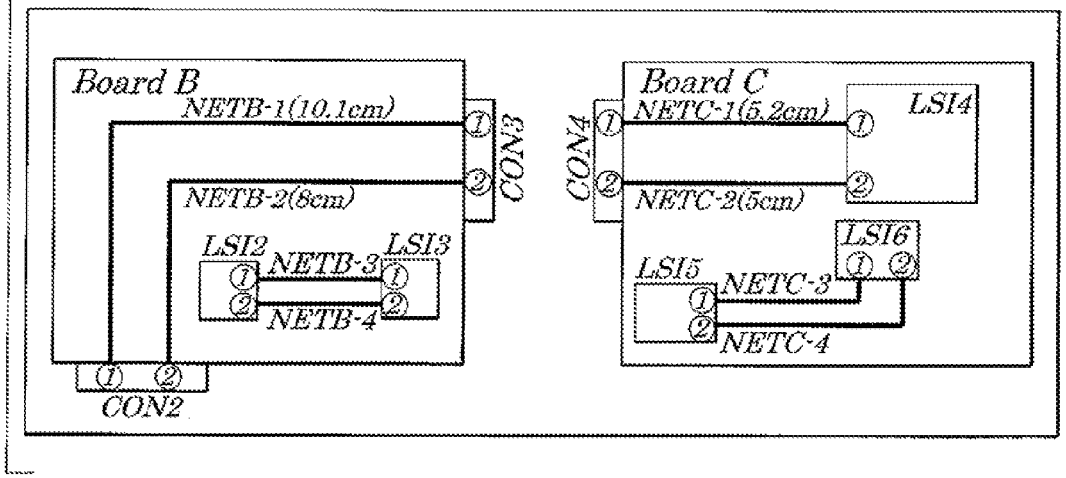

FIG.4

13: Inter-board Connection Information Block

Between Boards A - B
CON1 is connected to CON2.
Between Boards B - C
CON3 is connected to CON4.

14: Wiring Constraints Block

(1) NETA-1 and NETA-2 are equi-length and allowable error is 1cm.

(2) Longest length of each of NETA-1 and NETA-2 is 20cm.

15: Degenerate Parts Library Block

RESISTOR
First pin is connected to second pin of resistor.

CONDENSER
First pin is connected to second pin of condenser.

16: Parts Internal Wiring Information Block

LSI1  ① 0.2cm
      ② 0cm
CON1 ① 0cm
      ② 0cm

17: Ideal Board Wire Length Block

Non

*FIG.5*
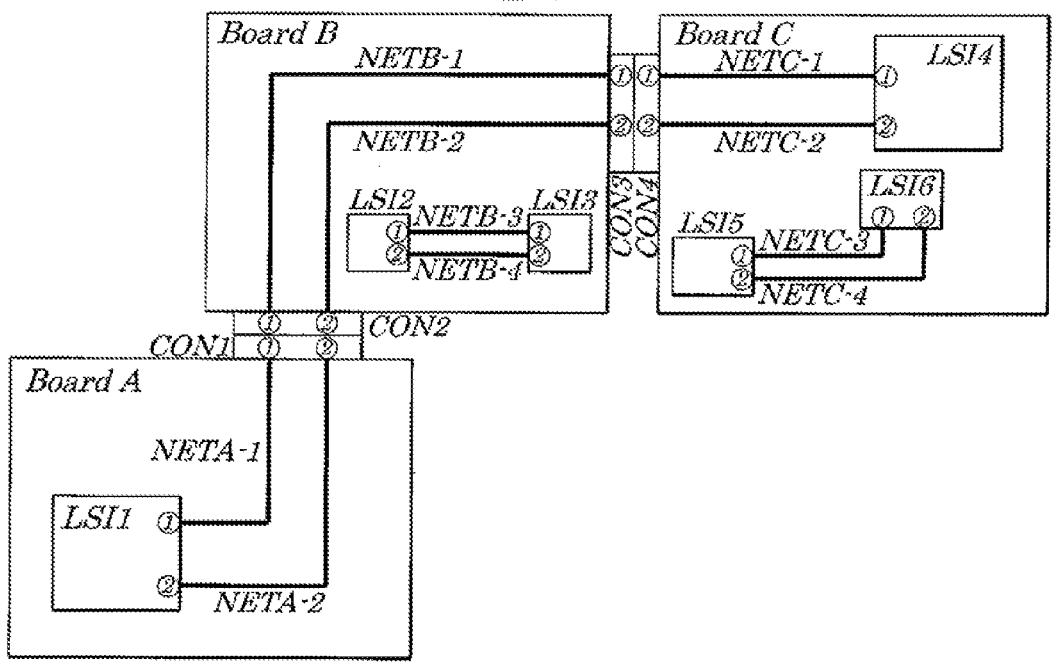
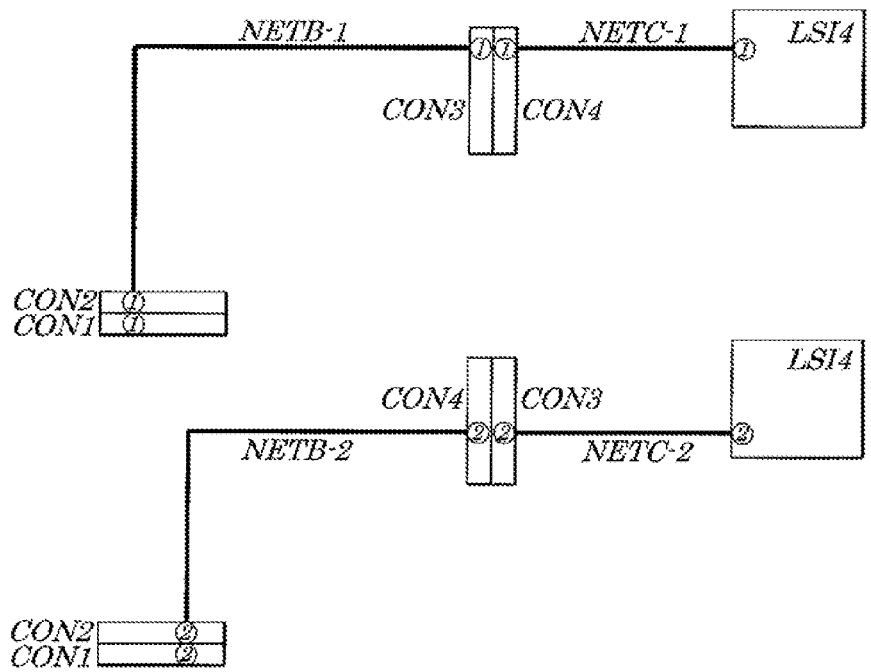

FIG.6

33: External Dummy Load Block

CON1 ① 15.5cm, 100%
CON1 ② 13 cm, 100%

34: Verification Results Block

(1) Line NETA-1 and NETA-2 are equi-length and allowable error is 1cm.
NETA-1 = 20.9cm, NETA-2 = 20cm
Allowable error = 0.9cm, which is acceptable.

(2) Longest wire strength of each of NETA-1 and NETA-2 is 20cm.
NETA-1 = 20.9cm, which is error.
NETA-2 = 20cm, which is acceptable.

WIRING VERIFICATION SYSTEM, WIRING VERIFICATION METHOD, AND WIRING VERIFICATION PROGRAM PRODUCT

This application is based upon and claims the benefit of priority from Japanese Patent Application No. 2009-088253, filed on Mar. 31, 2009, the disclosure of which is incorporated herein in its entirely by reference.

BACKGROUND OF THE INVENTION

1. Field of the Invention

The present invention relates to a wiring verification system, a wiring verification method, and a wiring verification program product for each supporting design of a printed circuit board, and more particularly to the wiring verification system, the wiring verification method, and the wiring verification computer program product each configured to realize one function or system using a plurality of printed circuit boards.

2. Description of the Related Art

Conventionally, when a printed circuit board (hereinafter, may be simply referred to as a board) is designed, costs have been cut by reducing the number of layers within the board (multi-layered board). However, the reduction in the number of layers within the board causes various malfunctions such as instability in transmission of high-speed signals owing to noise interference between wires passing through each of a plurality of boards. That is, if the number of layers within the board is reduced, it is made difficult to properly distribute wiring constraints so adjusted as to have a wiring condition for stable transmission of high-speed signals through a plurality of wires which is wired for every board. This causes the wiring constraints for a plurality of wires in every board to be complicated. Also, there occurs a necessity to reduce total skew (variation of signals transmitted through a plurality of wires) in a plurality of wires passing through a plurality of boards.

To solve such malfunction problems as mentioned above, the conventional technique of board designing employs two kinds of skew reducing methods, one being a division-type verification method in which a plurality of boards is divided for wire verification and another being a collective-type verification method in which a plurality of boards is verified collectively. The division-type verification method is a method in which wiring constraints is totally observed by dividing wiring constraints for every board and by complying with the wiring constraints in units of boards, which enables simplification of wiring constraints on the entirety of the boards. The collective-type verification method is a method in which all data is referenced to in a state where a plurality of boards is connected and has a merit in which no division of an allowable error in each board and of wiring constraints is required.

Moreover, a technology is disclosed in, for example, Japanese Patent Application Laid-open No. 2006-252285 to support designing of printed circuit boards, which is capable of performing designing work on a plurality of layers of boards that makes up one function or system. According to this technology, by synthesizing various pieces of circuit connection information about a plurality of boards into one piece of information or, if necessary, by dividing various pieces of circuit connection information into a plurality of pieces of wiring information for each board, wiring constraints information and/or designing constraint information can be collectively managed. This enables effective designing work of combined boards obtained by synthesizing functions or systems and further shortening of designing period, cost reduction, improvement of designing quality.

However, the above division-type verification method has a demerit in that the wiring constraints on an allowable error of the board in its entirety are stringent since the allowable error of the wiring constraints is equally divided for every board and, therefore, even if the allowable error of wiring constraints is satisfied in one board, the allowable error of wiring constraints is not satisfied in another board. Moreover, there is a fear that, since the wiring constraints cannot be divided on an equal condition for every board, the wiring constraints vary depending upon high-speed signals flowing through each wire, which makes the wiring constraints complicated and causes degradation of quality of boards.

In the collective-type verification method, the division of the allowable error and the division of wiring constraints are not required, however, all data in the state where a plurality boards is connected thereto is referenced and, therefore, the scale of data to be referenced thereto at one time is increased. As a result, the time for performing wiring verification is lengthened, which produces a fear of degradation of real time properties of the wiring constraints. Further, at the time of describing conditions for the wiring constraints, identifying designations of starting and ending points of external wires other than wires for the board to be designed is required, which causes complicated handling of conducting wiring verification. It is also necessary that paths other than the path of the board to be an object of wiring verification have been already wired and, as a result, reversion of work for re-verification at the time of error detection by wiring verification is increased, which is another demerit.

SUMMARY OF THE INVENTION

In view of the above, it is an object of the present invention to provide a wiring verification system, a wiring verification method, and a wiring verification computer program product, which each are capable of simultaneously solving the problems of complication of wiring verification for each board, which is a demerit of a division-type verification method, and the problems of total skew occurring in wires passing through a plurality of boards, which is a demerit of a collective-type verification method.

According to a first aspect of the present invention, there is provided a wiring verification system for verifying a wire passing through a plurality of boards including an external connection tracing unit to trace a single or a plurality of external boards each serving as an external path to be connected to a board to be an object of wiring verification and to produce external connection information, an external load generating unit to generate an external dummy load defining a wire length or wire delay of the external path based on external connection information created by the external connection tracing unit, and a wiring verification unit to verify a wire passing through a plurality of boards based on an external dummy load generated by the external load generating unit.

According to a second aspect of the present invention, there is provided a wiring verification method for verifying a wire passing through a plurality of boards, including an external connection tracing process of tracing a single or a plurality of external boards each serving as an external path to be connected to a board to be an object of wiring verification and to produce external connection information, an external load generating process of generating an external dummy load defining a wire length or wire delay of the external path based on external connection information created by the external connection tracing process, and a wiring verification method of verifying a wire passing through a plurality of boards based on an external dummy load generated by the external load generating process.

With the above configuration, instead of dividing the wiring constraints for every board, by using a value for actual wiring in each board, the wiring constraints for a board in its entirety can be configured not to be more stringent than required. As a result of not dividing the wiring constraints for every board, description of the wiring constraints can be made easy. Further by designating the wiring constraints only to a board to be an object of the wiring verification, the wiring constraints can be described easily. Still further by limiting the external information to be used for wiring verification only to the external dummy load required for the wiring verification, the real time property for the wiring verification can be maintained. Further, even if there are unwired portions in boards, the wiring verification can be conducted, which decreases reversion of work for re-verification at the time of error detection in the wiring verification.

BRIEF DESCRIPTION OF THE DRAWINGS

The above and other objects, advantages, and features of the present invention will be more apparent from the following description taken in conjunction with the accompanying drawings in which:

FIG. 3 is a diagram showing a specified configuration, an example (I), of the wiring verification system of FIG. 1;

FIG. 4 is a diagram showing another configuration, an example (II), of the wiring verification system of FIG. 1;

FIG. 5 is a diagram showing still configuration, an example (III), of the wiring verification system of FIG. 1; and FIG. 6 is a diagram showing still another configuration, an example (IV), of the wiring verification system of FIG. 1.

DETAILED DESCRIPTION OF THE PREFERRED EMBODIMENTS

Best modes of carrying out the present invention will be described in further detail using various exemplary embodiments with reference to the accompanying drawings. To solve the above problems, the present invention provides a wiring verification system including a system netlist creating unit (including a software means) to create a system netlist showing a theoretical connecting relation among each board based on wiring definition information showing a wiring state of each board and inter-board connection definition information showing a connection state between boards, an external connection tracing unit (including a software means) to trace connecting relation between a verification object board and an external board to generate external connection information based on the system netlist created by the system netlist creating unit, an external load generating unit (including a software means) to generate an external dummy load defining a wire length or wire delay between the verification object board and the external board based on external connection information created by the external connection tracing unit, and a wiring verification unit (including a software means) to verify wires passing through a plurality of boards based on an external dummy load generated by the external load generating unit.

That is, in the wiring verification system having the above configurations, external circuits of a printed circuit board (board) to be an object of verification are limited only to circuits having converted information required for wiring verification (i.e., external dummy load). This enables verification of wires passing through a plurality of boards using few wire resources without the need for distribution of wiring constraints on each board.

In other words, the wire verification system of the present invention, when a wire length for a high-speed signal passing through a plurality of boards is to be verified for designing of the printed circuit board, is so configured as to convert an external path to be connected to a board to be verified to a dummy load for linking of wires. This realizes relaxation of wiring constraints on a board, easiness of information description for the board, acquirement of real-time property in information description for the board, and pre-verification of a wire length of a high-speed signal passing through a plurality of boards.

First Exemplary Embodiment

Figure 1:
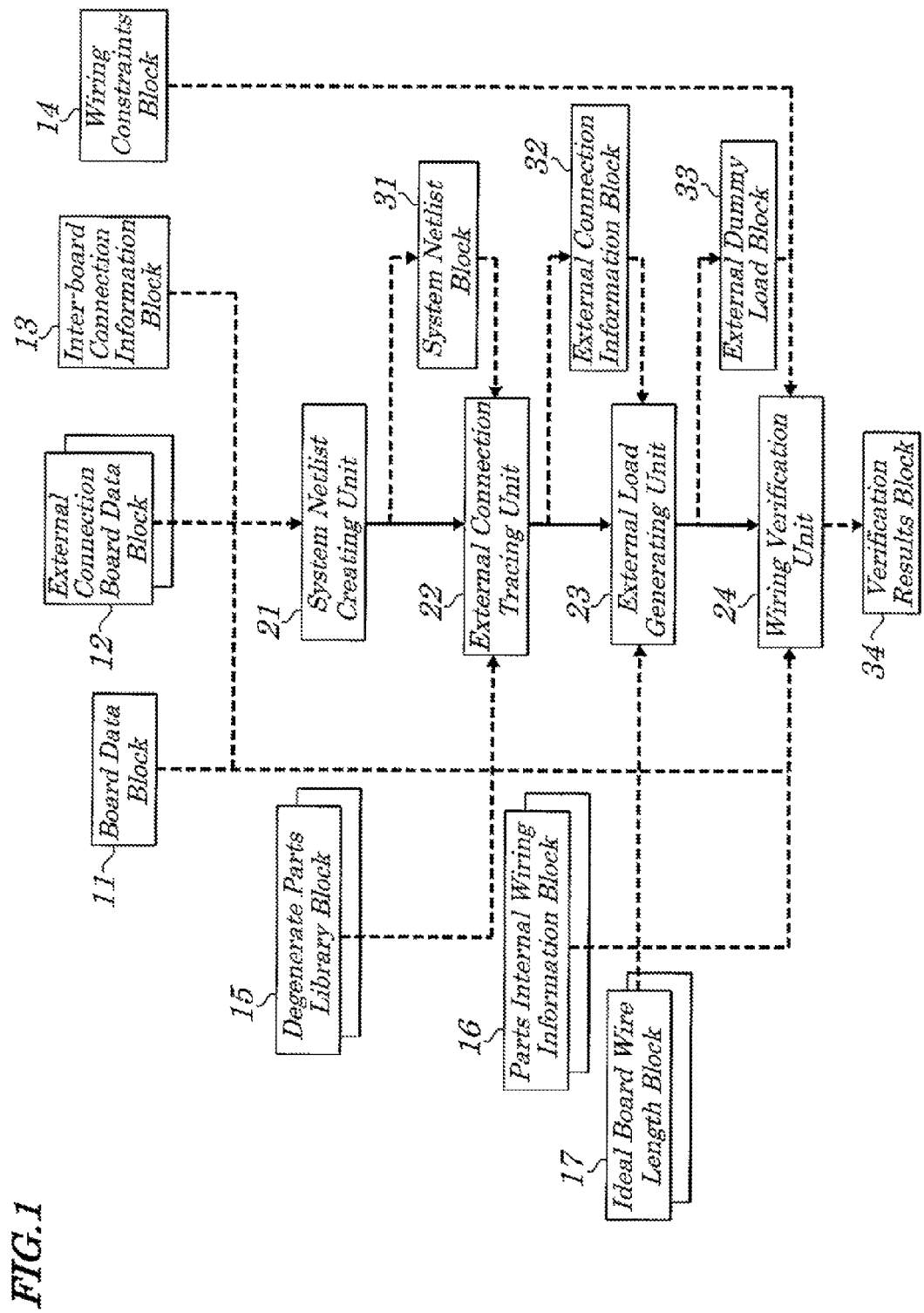
FIG. 1 is a block diagram showing configurations of a wiring verification system according to a first exemplary embodiment of the present invention.

Hereinafter, by referring to drawings, exemplary embodiments of the present invention are described in detail. FIG. 1 is a block diagram showing configurations of a wiring verification system according to a first exemplary embodiment of the present invention. As shown in FIG. 1, the wiring verification system of the first exemplary embodiment includes a board data block 11, an external connection board data block 12, an inter-board connection information block 13, a wiring constraints block 14, a degenerate parts library block 15, a parts internal wiring information block 16, an ideal board wire length block 17, a system netlist creating unit (including a software means) 21, an external connection tracing unit (including a software means) 22, an external load generating unit (including a software means) 23, a wiring verification unit (including a software means) 24, a system netlist block 31, an external connection information block 32, an external dummy load block 33, and a verification results block 34.

The board data block 11 defines netlist information defining a connection relation among parts, parts arrangement information, and signal wiring information for a board to be verified. The external connection board data block 12 defines data on boards other than the board data block 11 to be verified out of devices constructed by connecting to boards. The external connection board data block 12, as in the board data block 11, defines netlist information defining a connection relation among parts, parts arrangement information, and signal wiring information.

The inter-board connection information block 13 defines an inter-board connection relation based on a board instance (board requirement) using aboard into which data is inputted by the board data block 11 and external connection board data block 12. When boards are connected using connectors directly between one another, correspondence between a name of board kind of a high-order board and a name of connector location and correspondence among a name of board kind of a low-order board, a name of board instance, and a name of location of the connector are defined in a plurality of manners.

Moreover, when boards are directly connected using connectors between one another, a relation of high-order and low-order and a connection relation between high-order board kind and low-order board, kind are uniquely determined. The names of pins of the connectors used for the connection coincide with each other between boards.

Also, when connection is established between boards using cables, correspondence between a name of board instance and a name of connector location is defined, while correspondence between a name of board instance and name of connector location is defined and a connection rule for connector pins is defined in a plurality of manners.

Moreover, when boards are connected using cables, a high-order and low-order relation and a connection relation between one board kind and another board kind are not uniquely determined, correspondence has to be realized by using the board instance name. Pin names of connectors used for the connection do not necessarily coincide with one another between boards and, therefore, correspondence of the pin name has to be defined.

The above wiring constraints block 14 defines both wiring constraints of high-speed signals passing through a plurality of boards and wiring constraints on other signals. In the wiring constraints on the high-speed signals between boards, the wiring constraints is not divided exclusively to the board data block 11 to be verified, but a value itself of the wiring constraints is defined among LSIs.

Moreover, even if a signal to be an object of the wiring constraints or a driver of an LSI being a starting point or a receiver of an LSI being an ending point, both making up a starting and ending pin pairs, exist in the external connection board data 12 outside the board data block 11, the wiring constraints on the signal or starting and ending pin points the board data are defined and the wiring constraints on other signals is defined in the board data block 11.

The wiring constraints block 14 includes a constraint on a longest wire length, constraint on a shortest wire length, and constraint on an equi-length error. The longest line length constraint for wiring constrains a wire so that the starting and ending pin pairs have a longest wire length or less and a longest time or less. The shortest line length constraint for wiring constrains a wire so that the starting and ending pin pairs have a shortest wire length or more and a shortest time or more. The equi-length error constraint for wiring constrains a wire so that a wiring skew (variation) of a plurality of signals is an allowable error or less, or an allowable time or less.

The degenerate parts library block 15 defines a name of a part to be an object of degeneration and a connection relation of pins to be degenerated. The parts internal wiring information block 16 defines a wire length or wire delay of parts having internal wiring such as a connector part or package mounted LSI parts. The ideal board wire length block 17 defines an ideal wire length for each signal of a board to be verified and for a board to be connected externally. The system netlist block 31 defines a connection relation of a whole system. The external connection information block 32 defines a relation of connection from an external connecting connector of a board to be verified. The external dummy load block 33 defines a load on the external connecting connector of a board to be verified as a wire length or delay time and a ratio occupied by actual wiring out of the wire length or delay time. As the verification result block 34, results from the verification of the wiring constraints are outputted.

The system netlist creating unit 21 connects a netlist of each board based on the board data, external connection board data, and the inter-board connection information and creates the system netlist block 31 on a main memory.

The external connection tracing unit 22 traces a relation of connection from a pin of the connector to be connected between boards out of the board to be verified to the board based on the information from the system netlist block 31, inter-board connection information block 13, degenerate parts library block 15, and produces the external connection information block 32 on the main memory.

The external load generating unit 23 produces the external dummy load block 33 from the information from the external connection information block 32, the board data block 11, the external connection board data block 12, the parts internal wiring information block 16, and the ideal board wire length block, on the main memory or external memory. The wiring verification unit 24 produces the verification results block 34 based on the information from the board data block 11, the wiring constraints block 14, the parts internal wiring information block 16, and the external dummy load block 33.

In the configuration as above, when the system netlist creating unit 21 produces the system netlist block 31 for each board, the external connection tracing unit 22 extracts the external connection information block 32 based on the information from the system netlist block 31. The external load generating unit 23 produces the external dummy load block 33 based on the information from the extracted external connection information block 32. Next, the wiring verification unit 24 conducts the verification of a wiring state by using the produced external dummy load block 33. By configuring as above, both the proper distribution of wiring constraints on each board and the elimination of total skew can be simultaneously achieved.

Figure 2:
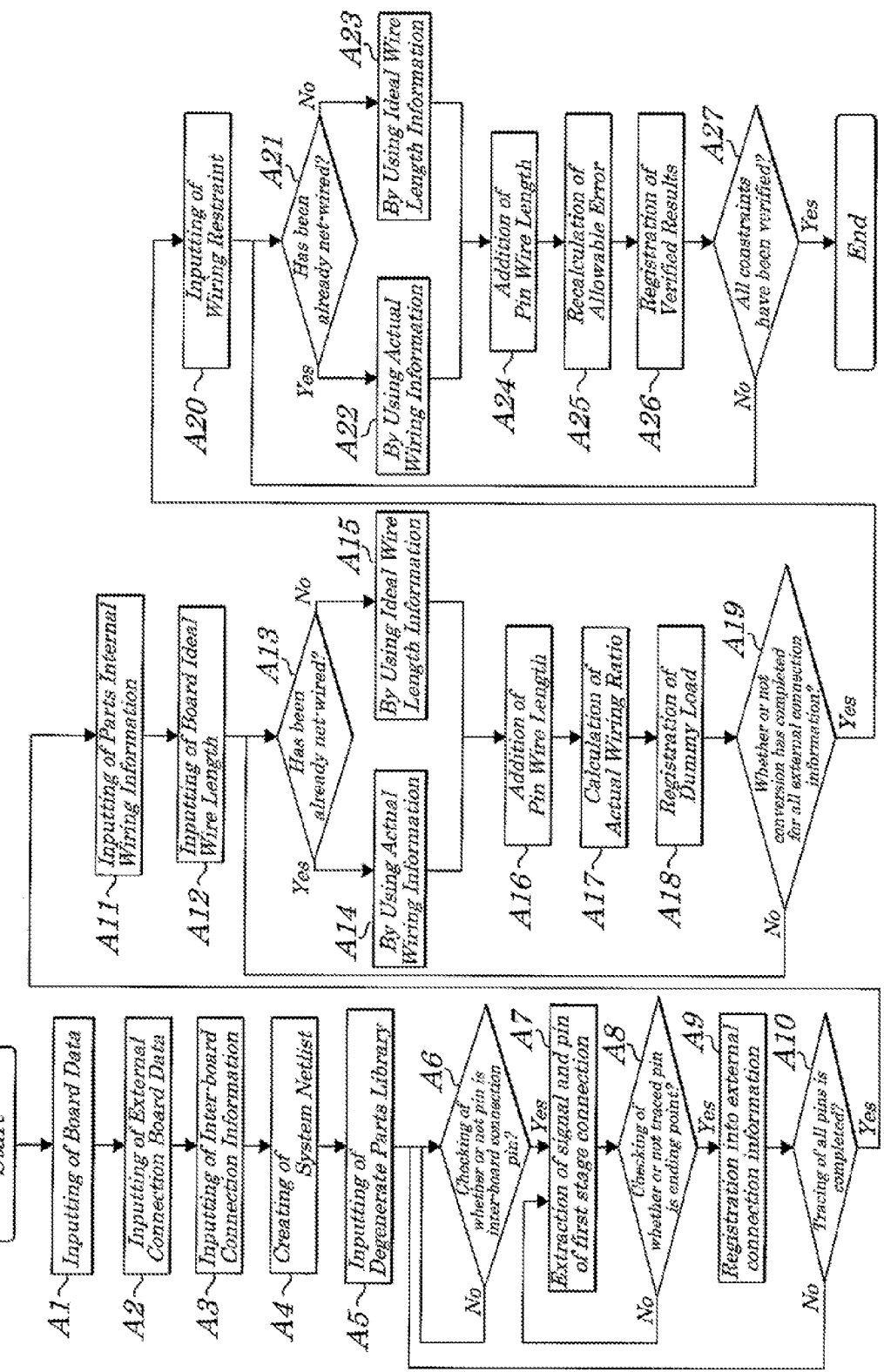
FIG. 2 is a flow chart showing a flow of operations of the wiring verification system shown in FIG. 1.

Next, by referring to a flow chart, entire operations of the wiring verification system of the first exemplary embodiment are described. FIG. 2 is a flow chart showing a flow of the operations of the wiring verification system shown in FIG. 1.

First, in Steps A1 to A4, the flow of processes in which the system netlist creating unit 21 produces the system netlist block 31 for each board is described. At the first stage of the processes, the information from the board data block 11 (Step A1), external connection board data block 12 (Step A2), and inter-board connection information block 13 are inputted (Step A3). Then, based on the connection information defined in the inter-board connection information block 13, connection is established between connectors for each of the inputted board and, by using the system netlist creating unit 21, the system netlist block 31 is produced (Step A4).

Next, in Steps A5 to A10, the flow of processes is described in which the external connection tracing unit 22 traces the system netlist block 31 whereby information about an external connection relation is extracted from connectors of a board to be verified to produce the external connection information block 32. That is, the information from the degenerate parts library block 15 is inputted into the main memory (Step A5) and whether or not a pin of the connector being an object of the inter-board connection out of connectors of the board data block 11 to be verified exists is checked (Step A6).

Then, when the pin of the connector being an object of the inter-board connection exists ("Yes" in Step A6), a signal to be connected to a first stage connection and the pin to be connected thereto (as the pin to be an object of the extraction) are extracted (Step A7). On the other hand, in Step A6, when the pin of the connector being an object of the inter-board connection does not exist ("No" in Step A6), since no object of extraction exists, whether or not a next pin of the connector being an object of inter-board connection exist is checked (Step A6).

Next, whether or not the traced pin as an object to be connected is an ending point is confirmed (Step A8). If the traced pin is a pin as a part written in the degenerate parts library block 15 or a pin of the inter-board connector, the pin is judged as an ending point ("No" in Step A8) and the process returns back to the Step A7 and tracing further another stage is performed. On the contrary, if the traced pin as an object to be connected is an ending point, the tracing process ends ("Yes" in Step A8) and traced connection information is inputted, for registration, into the external connection information block 32 (Step A9).

If the traced and connected pin is an ending point, tracing is completed and, after the traced connection information is inputted, for registration, into the external connection information block 32, the process is returned back to Step A6 and a next pin is to be sequentially traced. Then, whether or not all pins are traced is confirmed (Step A10) and the processes of Step A6 to Step A10 are repeated until the tracing of all pins is completed. When the tracing treatment of all pins is completed ("Yes" in Step A10), the process proceeds to Step A11.

Next, in Step A11 to Step A19, the external load generating unit 23 generates the external dummy load block 33 in which the external connection information block 32 is converted to an external wire length or a wire delay. First, the information from the parts internal wiring information block 16 is inputted (Step A11). Here, if pre-verification is performed in a state where there is a signal being to run on a wiring which has not yet been established in boards (hereinafter, referred to as an unwired signal), the ideal board wire length block 17 is inputted (Step A12). Then, the external connection information block 32 is sequentially referenced to and whether or not a line for a signal contained in the external connection information block 32 has already been net-wired for the board data block 11 or external connection board data block 12 is confirmed (Step A13).

If the line for the signal contained in the external connection information block 32 has been already net-wired for the board data block 11 or external connection board data block 12 ("Yes" in Step A13), by using, as a reference, information from actual wiring results of the board data block 11 or external connection board data block 12, the data is converted into a wire length or a wire delay (Step A14).

On the other hand, if a line for a signal contained in the external connection information block 32 has not yet been net-wired for the board data block 11 or external connection board data block 12, that is, in the case of unwired signal ("No in Step A15), the wire length or wire delay of the ideal board wire length block 17 is used (Step A15).

If the parts pin in the external connection information block 32 is the parts pin defined by the parts internal wiring information block 16, a wire length or wire delay for the pin is added (Step A16). Further, a ratio (actual wiring ratio) of an actual wire length to a total sum of a converted wire length and wire delay is calculated (Step A17) and information about the wire length, wire delay, and actual wiring ratio are inputted into the external dummy load block 33 for registration (Step A18).

Thus, whether or not the conversion of all the external connection information has been completed is checked (Step A19). If the conversion of all the external connection information has not yet been completed ("No" in Step A19), the process is returned back to the Step A13, the processes from the above-described Steps A13 to A19 are repeated by changing the dummy load for a subsequent connection information. If the conversion of all the external connection information has been completed ("Yes" in Step A19), the process proceeds to Step A20 for performing the subsequent processing.

Next, in Steps A20 to A27, the processing is performed in which the wiring verification unit 24 verifies the wiring for the board data block 11 while referencing to the external dummy load block 33, in priority order, based on the parts internal wiring information block 16. First, the information from the wiring constraints block 14 is inputted (Step A20) and, then, the wiring for the board data block 11 to be verified is sequentially verified. After that, whether or not the board data block 11 is already net-wired is checked (Step A21) and, if already net-wired ("Yes" in Step A21), the data is converted to the wire length or wire delay by referencing to the board data block 11 and, by using information about actual wiring (Step A22).

In the case of the unwired signal which is not net-wired ("No" in Step A21), the information about the wire length or wire delay for the ideal board wire length block 17 is utilized (Step A23). If the parts pin to be connected to the wiring to be verified is the pin defined by the external dummy load block 33 or the pin defined by the parts internal wiring information block 16, a value of the pin wire length or pin wire delay is added (Step A24). When both the external dummy load block 33 and the parts internal wiring information block 16 are defined, priority is given to the external dummy load block 33.

For the wiring connected to the pin which has been defined in the external dummy load block 33, the actual wiring ratio is again calculated from the actual wiring ratio, wire length, or wiring delay defined in the external dummy load block 33 and wire length or wire delay of the board data block 11 and the value obtained by multiplying the allowable error of wiring constraints by the actual wiring ratio is used as an allowable error (Step A25).

Whether or not the recalculated wire length or wiring delay satisfies a constraint value of the recalculated allowable error is verified and its results are inputted to the verification results block 34 for registration (Step A26). Thus, the processes of Steps A21 to A26 are repeated until the verification of all the wiring constraints is completed. When the verification of all the constraints is completed, the processing of wiring verification ends (Step A27).

Next, concrete examples of the wiring verification system of the first exemplary embodiment of the present invention are described. FIG. 3 is a diagram showing a specified configuration according to a first example of the wiring verification system shown in FIG. 1. FIG. 4 is a diagram showing a specified configuration according to a second example of the wiring verification system shown in FIG. 1. FIG. 5 is a diagram showing a specified configuration according to an example of the wiring verification system shown in FIG. 1. FIG. 6 is a diagram showing a specified configuration according to a fourth example of the wiring verification system shown in FIG. 1. Therefore, a reference number of each component shown in FIGS. 3 and 9 corresponds to the reference number of each of the components shown in FIG. 1. For example, the board data block 11 in FIG. 1 is shown as the board data block 11 in FIG. 3 and the system netlist block 31 in FIG. 1 is shown as the system netlist block 31 shown in FIG. 5.

Therefore, by referencing to FIG. 1 and FIGS. 3 to 6, concrete configurations of the wiring verification are described. As shown in FIG. 3, on a board A for the board data block 11 are mounted one LSI (LSI1), one connector (CON1) to be used for connection outside the board, and two signal lines (NETA-1 and NETA-2). The signal lines have been already wired.

For the external connection board data block 12 (FIG. 3), there exist two boards (boards B and C), five LSIs (LSI2, LSI3, LSI4, LSI5, LSI6), three connectors (CON2, CON3, CON4) and eight signal lines (NETB-1, NETB-2, NETB-3, NETB-4 and NETC-1, NETC-2, NETC-3, NETC-4). The signal lines also have been already wired.

The inter-board connection information block 13 defines a method of connection between boards A and B (connection between CON1 and CON2) and a method of connection between the boards B and C (connection between CON3 and CON4). Further, the wiring constraints block 14 defines two kinds of wiring constraints, one being the constraint that the signal lines NETA-1 and NETA-2 wired on the board A to be verified are equi-length and an allowable error of each of the NETA-1 and NETA-2 is 1 cm, another being the constraint that the longest wire length of each of the NETA-1 and NETA-2 is 20 cm. Moreover, any constraint value of the wire constraint is not divided to be used for each board, but the obtained value is used for an entire system.

The degenerate parts library block 15 (in FIG. 4) defines internal connection between a first pin and a second pin of each of a resistor and a condenser, both being parts being an object of degeneration. Moreover, the parts internal wiring information block 16 (FIG. 4) defines that the wire length of each of the first pin of the LSI and the first and second pins of the CON1 is 0 cm, which permits these pins to be omitted and, in the present invention, the wire length is explicitly shown. It is also defined that the wire length of the first pin of the LSI1 is 0.2 cm. In the ideal board wire length block 17 (FIG. 4), all the signal lines of a board are already wired and, therefore, the ideal wire length is not defined.

In the system netlist block 31 in FIG. 5, the state is shown in which the board A of the board data block 11 is connected to the boards B and C of the external connection board data block 12. In the external connection information block 12 (FIG. 5), connection information about the connection between the first pin of the CON1 of the board A in the board data block 11 and the outside and about the connection between the second pin of the CON1 of the board A in the board data block 11 and the outside.

In the external dummy load block 33 (FIG. 6), information is stored that an outside dummy load wire length of the first pin of the CON1 of the board A in the board data lock 11 is 15.5 cm and the actual wiring ratio is 100% and that the outside dummy wire length of the second pin of the CON1 of the board A is 13 cm and the actual wiring ratio is 100%. Moreover, in the verification results block 34 (FIG. 6), information about the allowable error of wire length defined in the wiring constraints block 14 and results from the judgment on wiring verification of the longest wire length are stored.

As shown in the flow chart of FIG. 2, the board data block 11 is inputted (Step A1), the external connection information block 32 is inputted (Step A2), and inter-board connection information block 13 is inputted (Step A3). Then, in accordance with the inter-board connection information block 13, for the connection between the boards A and B, the connection between CON1 and CON2 is an object of connection and, for the connection between the boards B and C, the connection between the board B and board C is an object of connection, and the theoretical connection relation between the board A and board C is created as the system netlist block 31 (Step A4). In the system netlist block 31 (FIG. 5), the state is shown in which the board A of the board data block 11 is connected to the boards B and C of the external connection board data block 12 using the connectors.

Next, the information from the degenerated library block 15 is inputted (Step A5) and the path to be an object of inter-board connection is sequentially traced. In the board A of the board data block 11, first pin and second pin of the CON1 are an object of inter-board connection pin (Step A6) and the wiring to be connected for the first pin of the CON1 is extracted. As the first stage wiring to be connected for the first pin, the signal line NETB-1 of the board B of the external connection board data block 12 and, as a pin to be connected, the first pin of the CON3 is found (Step A7). The first pin of the CON3 is not a tracing end point but an object of the inter-board connection ("No" of Step A8) and, therefore, the extraction is again performed as further one stage and, as a result, the first pin of the signal line NETC-1 and LSI9 of the board C of the external connection board data block 12 is found (Step A7).

The first pin of the LSI4 is not an object of the inter-board connection and is not defined in the degenerate parts library block 15 and, as a result, is judged as a trace ending point ("Yes" in Step A8) and the traced path is inputted into the external connection information block 32 for registration (Step A9).

In the same manner, the second pin of the CON1 of the board A in the board data block 11 is extracted and, by using the similar procedure, each of the wiring to be connected and, at the trace ending point (second pin of the LSI4), is inputted for registration (Steps A6 to A9). In the external connection information block 32 (FIG. 5), information about connection from the first pin of the CON1 of the board A in the board data block 11 to the first pin of the LSI4 to be connected to the outside and from the second pin of the CON1 of the board A in the board data block 11 to the second pin of the LSI4 to be connected to the outside. Thus, when the extraction of all the pins to be an object of inter-board connection is completed (Step A10), the process proceeds to the next Step A11.

Next, the information from the parts internal wiring information block 16 is inputted (Step A11) and the information from the ideal board wire length block 17 is inputted (Step A12). The path from the first pin of the board data block 11 (board A) registered in the external connection information block 32 and the path from the second pin of the CON2 are sequentially converted to a dummy load.

In the path of the first pin of the CON1 on the board A, the NETB-1 of the board B and NETC-1 of the board C in the external connection board data block 12 exist. These wires (NETB-1 and NETC-1) are already wired ("Yes" in Step A13) and, therefore, the wire length using actual wiring information is respectively 10.1 cm and 5.2 cm according to the external connection board data block 12 (Step, A14).

Moreover, according to the information from the parts internal wiring information 16, all the wire lengths of the pin other than that of the LSI1 is 0 cm and, therefore, no wire length is applied (Step A16). As a result, in the parts internal wiring information block 16, only the wire length of being 0.2 cm of the first pin of the LSI1 in the board A is considered for verification and the external dummy load wire length is a total sum of 15.5 cm (0.2 cm+10.1 cm+5.2 cm), indicating that all the wires are actually wired, causing the actual wiring ratio to become 100%. Thus, the calculated dummy load is inputted to the external dummy load block 33 for registration (Step A18).

Similarly, the dummy load of the path for the second pin of the CON1 in the board data block 11 is calculated and the total sum of the path in the external dummy load wire length becomes 13 cm (8 cm+5 cm), indicating that all the wires are actually wired, thus causing the actual wiring ratio to become 100% and these results are inputted to the external dummy load block 33 for registration (Steps A13 to A18). The external dummy load block 33 (FIG. 6) stores the information about the external dummy load wire length (15.5 cm) of the first pin of the CON1 mounted on the board A in the board data block 11, actual wiring ratio (100%), external dummy load wire length (13 cm) of the second pin of the CON1 mounted on the board A, and actual wiring ratio (100%). Thus, after the conversion of all the external load connection information is completed (Step A19), the process proceeds to the next Step A20.

Then, the wiring constraints information is inputted (Step A20) and the verification is sequentially performed on two wiring constraints described in the wiring constraints block 14, one being the constraint that the signal lines NETA-1 and NETA-2 wired on the board A to be verified are equal in length and an allowable error of each of the NETA-1 and NETA-2 is 1 cm, another being the constraint that the longest wire length of each of the NETA-1 and NETA-2 is 20 cm.

Here, a wire length is calculated to verify the board data block 11 (board A) by taking the external dummy load 33 in consideration. The NETA-1 on the board A is already net-wired ("Yes" in Step A21) and, therefore, the actual wire length (5.4 cm) is used as actual wiring information (Step A22). The wire lengths of the first pin of the LSI1 and first pin of the CON1 to be connected to the signal (NETA-1) are added (Step A23).

Here, as a wire length of the first pin of the LSI1, the length of 0.2 cm stored in the parts internal wiring information block 16 is employed and as a wire length of the first pin of the CON1, the length of 15.5 cm is employed in priority order. As a result, the line length of the NETA-1 is finally calculated as 5.4 cm+15.5 cm=20.9 cm and, similarly, the line length of the NETA-2 is finally calculated as 7 cm+13 cm=20 cm (Step A24).

When the actual wiring ratio of the NETA-1 and NETA-2 is calculated based on information about the equi-length error (1 cm) described in (1) in the wiring constraints block 14, the actual wiring ratio in both the cases is 100% and, therefore, the allowable error (1 cm) defined in the wiring constraints block 14 is applied (Step A25).

Thus, an error in length between the NETA-1 (20.9 cm) and the NETA-2 (20 cm) is 0.9 cm while the allowable error is 1 cm and, therefore, it is judged that no problem arises in the allowable error of wiring and the result is inputted for registration as the verification result 34 (Step A26).

Similarly, the longest wire length (20 cm) of the NETA-1 and NETA-2 defined in (2) in the wiring constraints block 14 is verified and its result is inputted to the verification results block 34 for registration (Step A21 to Step A26).

While the wiring constraints block 14 defines that (1) the NETA-1 and NETA-2 are equi-length and the allowable error is 1 cm, the result from the verification is that the NETA-1=20.9 cm and NETA-2=20 cm and the error=0.9 cm, that is, the result is acceptable and is stored in the verification results block 34 (FIG. 6). Since the longest wire length defined in the wiring constraints is 20 cm for the NETA-1 and NETA-2, the longest length of 20.9 cm for the NETA-1 is to be rejected and the length of 20 cm for the NETA-2 is to be accepted and this result is stored in the verification results block 34.

Thus, by converting wiring information outside the board into dummy load having less data load and by minimizing the distribution of the allowable error in a manner to correspond to a wiring state, the need for the distribution of wiring constraints can be negated and total skew can be reduced.

Second Exemplary Embodiment

In the wiring verification system of the second exemplary embodiment of the present invention, unlike in the case of the first exemplary embodiment in which a plurality of boards of a same kind is used, by applying the method of verification of the inter-board connection state disclosed in the previous invention (Japanese Patent Publication No. 3991224) by the same inventor of the prevent invention, extraction of the interboard connection can be effectively performed to realize a verification system.

The above-described wiring verification method (system) of the first and second exemplary embodiments can be realized by being read by a computer into a program. Therefore, processes of each treatment for the above wiring verification method are stored in a computer-readable storage median and the computer reads the program out for execution to perform each of the processes. The computer-readable storage medium includes a magnetic disk, optical magnetic disk, CD-ROM (Compact Disk-Read Only Memory), DVD-ROM (Digital Versatile Disk-Read Only Memory), semiconductor memory, and the like.

While the invention has been particularly shown and described with reference to exemplary embodiments thereof, the invention is not limited to these exemplary embodiments. For example, this program may be distributed to outside computers using a communication line so that the computer having received the distributed program executes the program. The wiring verification system of the present invention can be applied not only to IC circuit boards but also to hybrid circuit boards using discrete components.

The wiring verification system of the present invention can be effectively used for support of designing printed circuit boards made up of IC circuits and discrete circuits.

What is claimed is:

1. A wiring verification system for verifying a wire passing through a plurality of boards comprising:
    an external connection tracing unit to trace a single or a plurality of external boards each serving as an external path to be connected to a board to be an object of wiring verification and to produce external connection information;
    an external load generating unit to generate an external dummy load defining a wire length or wire delay of said external path based on said external connection information produced by said external connection tracing unit; and
    a wiring verification unit to verify a wire passing through a plurality of boards based on said external dummy load generated by said external load generating unit,
    wherein said external load generating unit generates said external dummy load with reference to information about a length of actual wiring when a signal line contained in said external connection information is already wired, and with reference to information about an ideal wire length when said signal line contained in said external connection information is not yet wired.

2. The wiring verification system according to claim 1, further comprising:
    a system netlist creating unit to create a system netlist showing a theoretical connection relation between boards based on wiring defining information showing a wiring state of each board and based on interboard connection defining information showing a connection state of each board,
    wherein said external connection tracing unit produces said external connection information by tracing a relation of connection between said board to be the object of wiring verification and each of said external boards, based on said system netlist created by said system netlist creating unit, and
    wherein said external load generating unit generates said external dummy load defining a wire length or wire delay between said board to be the object of wiring verification and each of said external boards, based on said external connection information produced by said external connection tracing unit.

3. The wiring verification system according to claim 2, wherein said wiring verification unit verifies a wire passing through said plurality of boards based on said system netlist, wiring constraints, parts internal wiring information, and said external dummy load.

4. The wiring verification system according to claim 3, wherein, in said parts internal wiring information, a relation of connection to an external connection terminal of said board to be the object of wiring verification is defined.

5. The wiring verification system according to claim 3, wherein, in said wiring constraints, a constraint on high-speed signal wiring passing through a plurality of boards and a constraint of other signal wiring on a signal in said board to be the object of wiring verification or starting and ending pin pairs are defined.

6. The wiring verification system according to claim 5, wherein said wiring constraints comprise a longest line length constraint that constrains wiring so that said starting and ending pin pairs have a longest wire length or less and a longest time or less, a shortest line length constraint that constrains wiring so that said starting and ending pin pairs have a shortest wire length or more and a shortest time or more, and equi-length error constraint that constrains wiring so that a wiring skew of a plurality of signals is an allowable error or less, or an allowable time or less.

7. The wiring verification system according to claim 2, wherein, in said external dummy load, a load on an external connection terminal of said board to be the object of wiring verification is defined as a wire length or delay time and a ratio occupied by actual wiring, out of said wire length or delay time, is defined.

8. A wiring verification method for verifying a wire passing through a plurality of boards, comprising:
an external connection tracing process of tracing a single or a plurality of external boards each serving as an external path to be connected to a board to be an object of wiring verification and to produce external connection information;
an external load generating process of generating an external dummy load defining a wire length or wire delay of said external path based on external connection information created by said external connection tracing process; and
a wiring verification method of verifying a wire passing through a plurality of boards based on said external dummy load generated by said external load generating process,
wherein said external load generating process generates said external dummy load with reference to information about a length of actual wiring when a signal line contained in said external connection information is already wired, and with reference to information about an ideal wire length when said signal line contained in said external connection information is not yet wired.

9. The wiring verification method according to claim 8, further comprising:
a system netlist creating process of creating a system netlist showing a theoretical connection relation between boards based on wiring defining information showing a wiring state of each board and based on inter-board connection defining information showing a connection state of each board,
wherein said external connection tracing process produce said external connection information by tracing a relation of connection between said board to be the object of wiring verification and each of said external boards, based on said system netlist created by said system netlist creating process;
wherein said external load generating process generate said external dummy load defining a wire length or wire delay between said board to be the object of wiring verification and each of said external boards, based on said external connection information produced through said external connection tracing process.

10. The wiring verification method according to claim 9, wherein said wiring verification process verifies a wire passing through said plurality of boards based on said system netlist, wiring constraints, parts internal wiring information, and said external dummy load.

11. The wiring verification method according to claim 10, wherein, in said parts internal wiring information, a relation of connection to an external connection terminal of said board to be the object of wiring verification is defined.

12. The wiring verification method according to claim 10, wherein, in said wiring constraints, a constraint on a high-speed signal wire passing through a plurality of boards and a constraint of other signal wiring on a signal in said board to be the object of wiring verification or starting and ending pin pairs are defined.

13. The wiring verification method according to claim 12, wherein said wiring constraints comprise a longest line length constraint that constrains wiring so that said starting and ending pin pairs have a longest wire length or less and a longest time or less, a shortest line length constraint that constrains wiring so that said starting and ending pin pairs have a shortest wire length or more and a shortest time or more, and equi-length error constraint that constrains wiring so that a wiring skew of a plurality of signals is an allowable error or less, or an allowable time or less.

14. The wiring verification method according to claim 9, wherein, in said external dummy load generating process, a load on an external connection terminal of said board to be the object of wiring verification is defined as a wire length or delay time and a ratio occupied by actual wiring, out of said wire length or delay time, is defined.

15. A non-transitory computer readable storage medium storing a wiring verification program to make a computer function as a wiring verification system for verifying a wire passing through a plurality of boards, the system comprising:
an external connection tracing unit to trace a single or a plurality of external boards each serving as an external path to be connected to a board to be an object of wiring verification and to produce external connection information;
an external load generating unit to generate an external dummy load defining a wire length or wire delay of said external path based on said external connection information created by said external connection tracing unit; and
a wiring verification unit to verify a wire passing through a plurality of boards based on said external dummy load generated by said external load generating unit,
wherein said external load generating unit generates said external dummy load with reference to information about a length of actual wiring when a signal line contained in said external connection information is already wired, and with reference to information about an ideal wire length when said signal line contained in said external connection information is not yet wired.

16. A non-transitory computer readable storage medium storing a wiring verification program to make a computer execute a wiring verification method for verifying a wire passing through a plurality of boards, the method comprising:
an external connection tracing process of tracing a single or a plurality of external boards each serving as an external path to be connected to a board to be an object of wiring verification and to produce external connection information;

an external load generating process of generating an external dummy load defining a wire length or wire delay of said external path based on said external connection information created by said external connection tracing process; and a wiring verification method of verifying a wire passing through a plurality of boards based on an external dummy load generated by said external load generating process, wherein said external load generating process generates said external dummy load with reference to information about a length of actual wiring when a signal line contained in said external connection information is already wired, and with reference to information about an ideal wire length when said signal line contained in said external connection information is not yet wired.

17. A wiring verification system for verifying a wire passing through a plurality of boards comprising:

an external connection tracing means to trace a single or a plurality of external boards each serving as an external path to be connected to a board to be an object of wiring verification and to produce external connection information;

an external load generating means to generate an external dummy load defining a wire length or wire delay of said external path based on said external connection information created by said external connection tracing means; and a wiring verification means to verify a wire passing through a plurality of boards based on said external dummy load generated by said external load generating means, wherein said external load generating means generates said external dummy load with reference to information about a length of actual wiring when a signal line contained in said external connection information is already wired, and with reference to information about an ideal wire length when said signal line contained in said external connection information is not yet wired.

18. The wiring verification system according to claim 17, further comprising:

a system netlist creating means to create a system netlist showing a theoretical connection relation between boards based on wiring defining information showing a wiring state of each board and based on inter-board connection defining information showing a connection state of each board, wherein said external connection tracing means produces said external connection information by tracing a relation of connection between said board to be the object of wiring verification and each of said external boards, based on said system netlist created by said system netlist creating means, and wherein said external load generating means generates said external dummy load defining a wire length or wire delay. between said board to be the object of wiring verification and each of said external boards, based on said external connection information produced by said external connection tracing means.

* * * * *